United States Patent
Kim et al.

(10) Patent No.: US 7,947,993 B2
(45) Date of Patent: May 24, 2011

(54) LIGHT EMITTING DEVICE HAVING ISOLATING INSULATIVE LAYER FOR ISOLATING LIGHT EMITTING CELLS FROM EACH OTHER AND METHOD OF FABRICATING THE SAME

(75) Inventors: Dae Won Kim, Seoul (KR); Dae Sung Kal, Seongnam-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 168 days.

(21) Appl. No.: 12/514,522

(22) PCT Filed: Dec. 18, 2006

(86) PCT No.: PCT/KR2006/005514
§ 371 (c)(1),
(2), (4) Date: May 12, 2009

(87) PCT Pub. No.: WO2008/075797
PCT Pub. Date: Jun. 26, 2008

(65) Prior Publication Data
US 2010/0051977 A1      Mar. 4, 2010

(51) Int. Cl.
*H01L 33/00* (2010.01)

(52) U.S. Cl. ....... 257/93; 257/82; 257/88; 257/E33.023; 257/E33.056

(58) Field of Classification Search ............... 257/82, 257/88, 93
See application file for complete search history.

(56) References Cited

U.S. PATENT DOCUMENTS
2002/0153529 A1 * 10/2002 Shie ................................ 257/88
(Continued)

FOREIGN PATENT DOCUMENTS
KR      10-0635346      * 10/2006
(Continued)

OTHER PUBLICATIONS

Taiwanese Preliminary Notice of the First Office Action dated Jan. 12, 2010.
(Continued)

*Primary Examiner* — Ahmed Sefer
(74) *Attorney, Agent, or Firm* — H.C. Park & Associates, PLC

(57) ABSTRACT

Disclosed is a light emitting device having an isolating insulative layer for isolating light emitting cells from one another and a method of fabricating the same. The light emitting device comprises a substrate and a plurality of light emitting cells formed on the substrate. Each of the light emitting cells includes a lower semiconductor layer, an upper semiconductor layer positioned on one region of the lower semiconductor layer, and an active layer interposed between the lower and upper semiconductor layers. Furthermore, an isolating insulative layer is filled in regions between the plurality of light emitting cells to isolate the light emitting cells from one another. Further, wirings electrically connect the light emitting cells with one another. Each of the wirings connects the lower semiconductor layer of one light emitting cell and the upper semiconductor layer of another light emitting cell adjacent to the one light emitting cell. Accordingly, there can be provided a light emitting device wherein particles are prevented from remaining between the plurality of light emitting cells to prevent current leakage between the light emitting cells. Further, there can be provided a light emitting device wherein the regions between light emitting cells are filled with an isolating insulative layer to facilitate formation of the wirings.

6 Claims, 5 Drawing Sheets

U.S. PATENT DOCUMENTS

| | | |
|---|---|---|
| 2004/0211970 A1 | 10/2004 | Hayashimoto et al. |
| 2006/0169993 A1* | 8/2006 | Fan et al. .................. 257/88 |
| 2008/0164485 A1* | 7/2008 | Lee ........................... 257/93 |

FOREIGN PATENT DOCUMENTS

| | | |
|---|---|---|
| TW | 200627679 | 8/2006 |
| WO | 2004-023568 | 3/2004 |
| WO | 2006-080609 | 8/2006 |

OTHER PUBLICATIONS

Da-Ren Zhuang,VLSI Manufacturing Technique, Gao-Li Library, Ltd., Dec. 10, 2003, pp. 493-494 and 515-516, 5th Edition.

* cited by examiner

LIGHT EMITTING DEVICE HAVING ISOLATING INSULATIVE LAYER FOR ISOLATING LIGHT EMITTING CELLS FROM EACH OTHER AND METHOD OF FABRICATING THE SAME

CROSS-REFERENCE TO RELATED APPLICATION

This application is the National Stage of International Application No. PCT/KR2006/005514, filed Dec. 18, 2006, which is hereby incorporated by reference for all purposes as if fully set forth herein.

BACKGROUND OF THE INVENTION

1. Field of the Invention

The present invention relates to a light emitting device having a plurality of light emitting cells on a single substrate, and more particularly, to a light emitting device having an isolating insulative layer for isolating a plurality of light emitting cells from one another on a single substrate, and a method of fabricating the light emitting device.

2. Discussion of the Background

There have been developed light emitting devices operated under high-voltage and AC power for use in general illumination. Such a light emitting device has been disclosed in WO 2004/023568(A1) entitled "Light-emitting device having light-emitting elements" by Sakai et al.

The light emitting device has a plurality of light emitting diodes (hereinafter, referred to as light emitting cells) on a single substrate. The plurality of light emitting cells are connected in series and reverse parallel with one another through metal wirings so that they can be connected directly to a high-voltage and AC power source.

FIGS. 1 to 3 are schematic sectional views illustrating a method of fabricating a light emitting device having a plurality of light emitting cells according to a prior art, and FIG. 4 is a plan view of FIG. 2.

Referring to FIG. 1, a buffer layer 20, an N-type semiconductor layer 30, an active layer 40 and a P-type semiconductor layer 50 are sequentially formed on an entire surface of a sapphire substrate 10.

Referring to FIG. 2, the P-type semiconductor layer 50, the active layer 40, the N-type semiconductor layer 30 and the buffer layer 20 are patterned using photolithographic and etching processes such that a plurality of light emitting cell regions are isolated from one another. Further, portions of the P-type semiconductor layer 50 and the active layer 40 are etched such that a portion of the N-type semiconductor layer 30 can be exposed as shown by a dotted line. Therefore, as shown in FIG. 4, a portion of the N-type semiconductor layer 30 is exposed and a plurality of light emitting cells electrically isolated by trenches are formed on the substrate 10.

Referring to FIG. 3, a transparent electrode layer 60 is formed on the P-type semiconductor layer 50. The transparent electrode layer 60 of one light emitting cell is connected to the exposed N-type semiconductor layer 30 of another light emitting cell adjacent to the one light emitting cell through a conductive wring 70.

Through the conductive wirings 70, arrays of the light emitting cells connected in series are provided on the substrate 10 and are connected in reverse parallel with each other, so that a light emitting device operating under an AC power source can be provided.

However, since the P-type semiconductor layer 50, the active layer 40, the N-type semiconductor layer 30 and the buffer layer 20 are patterned in the method of fabricating the light emitting device according to the prior art, the deep trenches are formed between the light emitting cells. Accordingly, particles may easily remain in the trench, and a process of forming wirings through which light emitting cells are connected to one another is difficult. Current leakage may occur between the light emitting cells due to the particles. Such current leakage reduces light emitting efficiency and results in device failure.

Meanwhile, since GaN-based light emitting devices emit short-wavelength light such as blue or ultraviolet light, it is necessary to implement mixed light, e.g. white light, by converting wavelength of the light emitted from the light emitting devices so that the light emitting devices can be used for general illumination. In particular, a light emitting device having a wavelength conversion material layer at a chip level is necessary to simplify packaging processes.

SUMMARY OF THE INVENTION

An object of the present invention is to provide a light emitting device having a plurality of light emitting cells on a single substrate and capable of preventing current leakage between the light emitting cells.

Another object of the present invention is to provide a light emitting device wherein wirings through which light emitting cells are electrically connected to one another are easily formed.

A further object of the present invention is to provide a light emitting device capable of emitting mixed light at a chip level.

To achieve the aforementioned objects of the invention, there is provided a light emitting device having an isolating insulative layer for isolating a plurality of light emitting cells from one another, and a method of fabricating the same. The light emitting device according to an aspect of the present invention comprises a substrate and a plurality of light emitting cells formed on the substrate. Each of the light emitting cells includes a lower semiconductor layer, an upper semiconductor layer positioned on one region of the lower semiconductor layer, and an active layer interposed between the lower and upper semiconductor layers. Furthermore, an isolating insulative layer is filled in regions between the plurality of light emitting cells to isolate the light emitting cells from one another. Further, wirings electrically connect the light emitting cells with one another. Each of the wirings connects the lower semiconductor layer of one light emitting cell and the upper semiconductor layer of another light emitting cell adjacent to the one light emitting cell. Accordingly, there can be provided a light emitting device wherein particles are prevented from remaining between the plurality of light emitting cells, and thus current leakage can be prevented from occurring between the light emitting cells. Further, there can be provided a light emitting device wherein the regions between light emitting cells are filled with an isolating insulative layer to easily form the wirings.

The isolating insulative layer is formed to have almost the same height as the light emitting cells. That is, the isolating insulative layer has a top surface almost corresponding to a top surface of the upper semiconductor layer. Thus, wirings formed on the upper semiconductor layer and the isolating insulative layer can be easily formed.

In some embodiments of the present invention, the isolating insulative layer may be formed of an insulating layer and made of, for example, $SiO_2$ or SOG.

In another embodiment of the present invention, the isolating insulative layer may be a structure stacked with semiconductor layers which are counter-doped through ion implantation processes. Additionally, each of the counter-doped semiconductor layers is formed by injecting at least one kind of ions selected from the group consisting of N, O, Fe and V into the semiconductor layer at the dosage of $10^{15}$ to $10^{22}$ ions/cm$^2$.

Meanwhile, transparent electrode layers may be positioned on the respective upper semiconductor layers of the plurality of light emitting cells. At this time, each of the wirings is electrically connected to the upper semiconductor layer through the transparent electrode layer.

In the embodiments of the present invention, the light emitting device may further comprise a wavelength conversion material layer containing phosphors. The wavelength conversion material layer covers the light emitting cells and the isolating insulative layer. Accordingly, a light emitting device capable of implementing mixed light, e.g. white light, at a chip level can be provided.

A method of fabricating a light emitting device according to another aspect of the present invention comprises forming a lower semiconductor layer, an active layer and an upper semiconductor layer on a substrate. Then, an isolating insulative layer for isolating a plurality of light emitting cell regions from one another is formed. Further, a plurality of light emitting cells are formed by exposing portions of the lower semiconductor layers in the respective light emitting cell regions. Furthermore, wirings electrically connect the light emitting cells with one another. Each of the wirings connects the lower semiconductor layer of one light emitting cell and the upper semiconductor layer of another light emitting cell adjacent to the one light emitting cell.

Before forming the wirings, a transparent electrode layer may be formed on the upper semiconductor layer of each of the light emitting cells. The transparent electrode layer is employed to uniformly distribute current flow over the upper semiconductor layer.

In some embodiments of the present invention, the formation of an isolating insulative layer may comprise patterning the lower semiconductor layer, the active layer and the upper semiconductor layer, which are formed on the substrate, to form a trench which isolates the light emitting cell regions from one another; and filling the trench with an insulating layer. The insulating layer may be formed of SiO$_2$ or SOG.

For example, the step of filling the trench comprises the step of applying SOG on the substrate with the trench formed thereon. Then, the SOG is cured, and the SOG on the upper semiconductor layer is removed. The SOG on the upper semiconductor layer may be removed using a CMP process.

In another embodiment of the present invention, the formation of an isolating insulative layer may comprise forming mask patterns, which define light emitting cell regions, on the upper semiconductor layer. Ions are implanted into the upper and lower semiconductor layers using the mask patterns as an ion implantation mask, and the mask patterns are then removed.

The ions may be selected from the group consisting of N, O, Fe and V to counter-dope the lower semiconductor layers and the active layer. Accordingly, the isolating insulative layer can be formed through the ion implantation processes without etching the buffer layer, the lower semiconductor layer, the active layer and the upper semiconductor layer.

After forming the wirings, a wavelength conversion material layer which covers the plurality of light emitting cells and the isolating insulative layer may be formed. The wavelength conversion material layer contains phosphors.

The wavelength conversion material layer may be formed by positioning a cap with an inlet on the substrate with the plurality of light emitting cells and the isolating insulative layer formed thereon, injecting resin containing phosphors through the inlet and then curing the injected resin. On the other hand, the wavelength conversion material layer may be formed by covering the substrate with a gel type resin layer and curing the gel type resin layer. Further, the wavelength conversion material layer may be formed by applying the resin and nano sized phosphors on the substrate using a spraying process.

According to the present invention, there can be provided a light emitting device wherein an isolating insulative layer is formed between light emitting cells to be able to prevent current leakage between the light emitting cells on a single substrate. Further, the isolating insulative layer can facilitate the formation of wirings through which light emitting cells are connected electrically to one another. Meanwhile, since a wavelength conversion material layer containing phosphors is formed on the light emitting cells and the isolating insulative layer, a light emitting device capable of emitting mixed light at a chip level can be provided.

DETAILED DESCRIPTION OF THE ILLUSTRATED EMBODIMENTS

Figure 1:
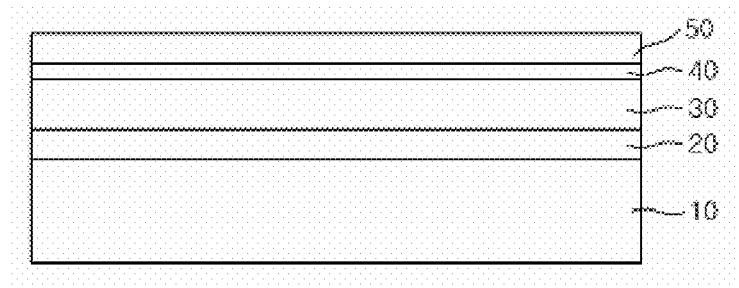
FIGS. 1 to 3 are sectional views illustrating a method of fabricating a light emitting device having a plurality of light emitting cells according to a prior art.
Figure 2:
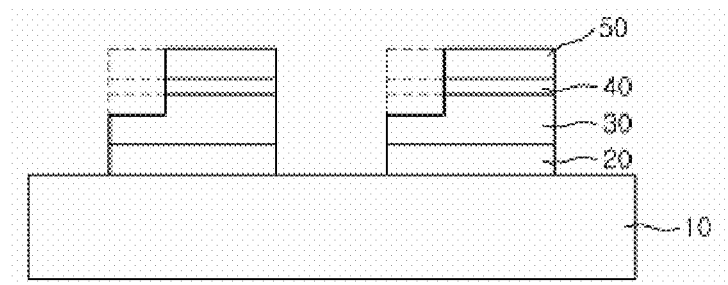
Figure 3:
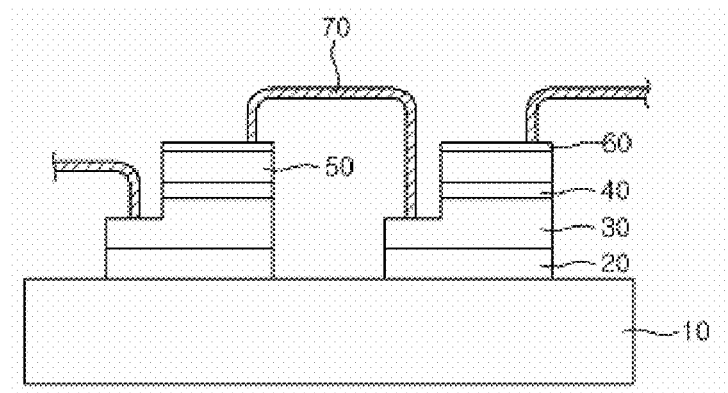
Figure 4:
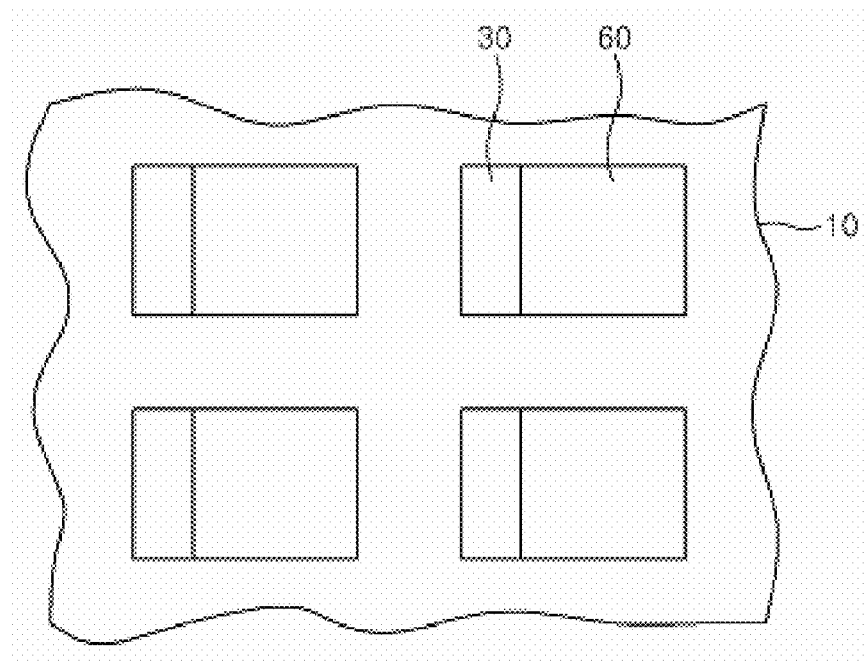
FIG. 4 is a plan view of FIG. 2 illustrating the method of fabricating a light emitting device having a plurality of light emitting cells according to the prior art.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 5:
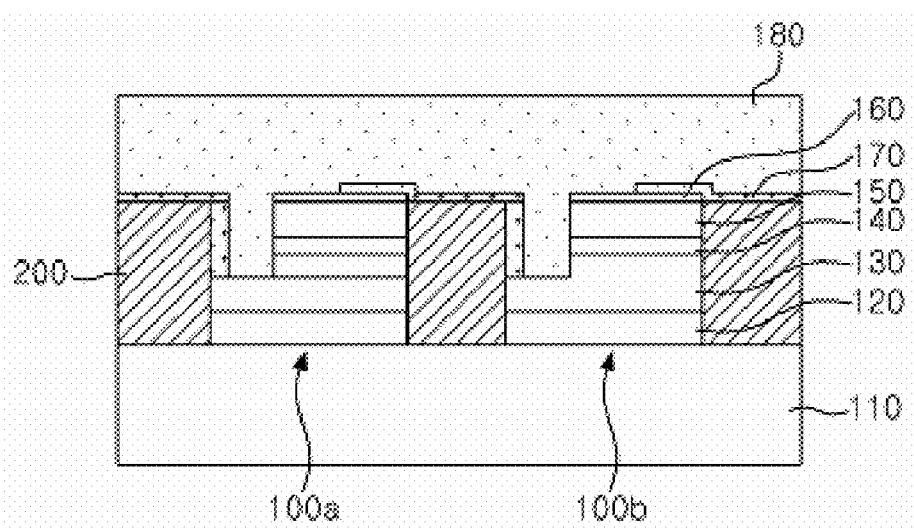
FIG. 5 is a sectional view illustrating a light emitting device having an isolating insulative layer for isolating light emitting cells from one another according to an embodiment of the present invention.
Figure 6:
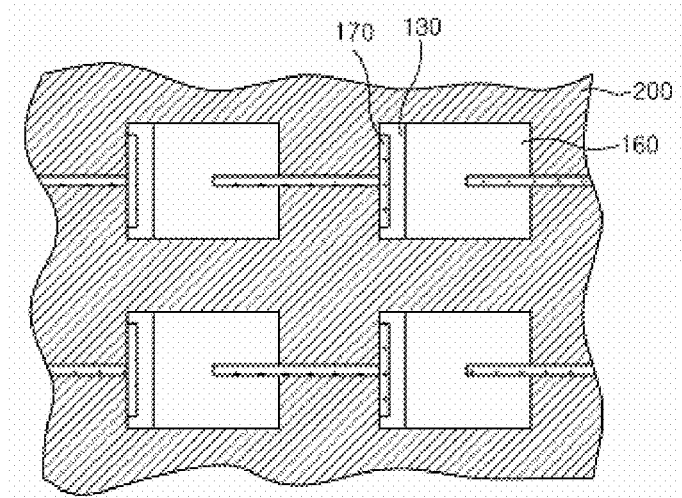
FIG. 6 is a plan view illustrating a light emitting device having an isolating insulative layer for isolating light emitting cells from one another according to the embodiment of the present invention.

FIGS. 5 and 6 are sectional and plan views illustrating a light emitting device having an isolating insulative layer for isolating light emitting cells from one another according to an embodiment of the present invention, respectively.

Referring to FIGS. 5 and 6, a plurality of light emitting cells 100*a* and 100*b* are formed on a substrate 110. Each of the light emitting cells 100*a* and 100*b* comprises an N-type semiconductor layer 130, an active layer 140 formed on a portion of the N-type semiconductor layer 130, and a P-type semiconductor layer 150 formed on the active layer 140. Furthermore, buffer layers 120 may be interposed between the substrate 110 and the respective light emitting cells 100a and 100b. Although the buffer layers 120 may be isolated from each other as shown in FIG. 5, the present invention is not limited thereto. That is, in a case where the buffer layers are high-resistance layers or insulating layers, the buffer layers 120 may be continuous to each other. Further, a transparent electrode layer 160 may be formed on the P-type semiconductor layer 150. Meanwhile, a region between the light emitting cells 100a and 100b is filled with an isolating insulative layer 200 such that the adjacent light emitting cells 100a and 100b are isolated from each other. The isolating insulative layer 200 may be formed to have almost the same height as the light emitting cells 100a and 100b.

Further, wirings 170 are formed on the light emitting cells and the isolating insulative layer 200 to electrically connect the light emitting cells to each other. Each of the wirings 170 connects the N-type semiconductor layer 130 of one light emitting cell 100b and the transparent electrode layer 160 of another light emitting cell 100a adjacent the light emitting cell 100b such that the light emitting cells are electrically connected to each other.

Furthermore, a wavelength conversion material layer 180 may cover the light emitting cells 100a and 100b and the isolating insulative layer 200. The wavelength conversion material layer 180 contains phosphors to allow at least a portion of light emitted from the light emitting cells 100a and 100b to be wavelength converted. Accordingly, light with various wavelengths and mixed light, e.g. white light, may be implemented at a chip level.

Here, the substrate 110 may be an insulating or conductive substrate. In a case where the substrate 110 is a conductive substrate, the light emitting cells 100a and 100b are electrically insulated from the substrate 110 by means of the buffer layer 120 or another insulating layer (not shown). Furthermore, the buffer layer 120 is employed to prevent the occurrence of defects due to lattice mismatch between the substrate 110 and the N-type semiconductor layer 130.

The N-type semiconductor layer 130 is a semiconductor layer doped with N-type impurities. The N-type semiconductor layer 130 may be a GaN-based compound semiconductor layer, but the present invention is not limited thereto. That is, a variety of semiconductor layers may be employed. Further, the N-type semiconductor layer 130 may comprise an N-type clad layer. On the other hand, the P-type semiconductor layer 150 is a semiconductor layer doped with P-type impurities. The P-type semiconductor layer 150 may be a GaN-based compound semiconductor layer, but the present invention is not limited thereto. That is, a variety of semiconductor layers may be employed. Further, the P-type semiconductor layer 150 may comprise a P-type clad layer.

Each of the N-type and P-type semiconductor layers 130 and 150 may be formed as a multilayer film with at least two layers. In a case where the N-type and P-type semiconductor layers 130 and 150 are formed as the GaN based compound semiconductor layers, Si and Mg may be used as the N-type and P-type impurities, respectively. However, the present invention is not limited thereto. That is, various kinds of impurities may be employed.

The active layer 140 may have a single quantum well structure with a single quantum well layer or a multiple quantum well structure in which quantum well layers and barrier layers are repeatedly formed. Meanwhile, the wavelength of light emitted is changed depending on the kind of a material constituting the active layer 140. Each of the barrier and well layers may be formed of $Al_xIn_yGa_{1-x-y}N$ ($0 \leq x+y \leq 1$). At this time, the barrier layer is formed of a material with a band gap greater than that of the well layer. Although each of the barrier and well layers may not be doped with impurities, the present invention is not limited thereto. That is, each of the barrier and well layers may be doped with impurities.

The transparent electrode layer 160 is employed for uniform current spreading over the P-type semiconductor layer 150. Indium tin oxide (ITO) or Ni/Au may be used as the transparent electrode layer 160.

The isolating insulative layer 200 electrically insulates the light emitting cells 100a and 100b formed on the substrate 110 from each other and also prevents particles from remaining in a region between the light emitting cells 100a and 100b.

In some embodiments of the present invention, the isolating insulative layer 200 may be formed of a transparent insulating material such as $SiO_2$ film or SOG (Spin on Glass).

In another embodiment of the present invention, the isolating insulative layer 200 may have a structure stacked with semiconductor layers which are counter-doped through ion implantation processes. That is, the isolating insulative layer 200 may have a structure in which the buffer layer 120, the N-type semiconductor layer 130, the active layer 140 and the P-type semiconductor layer 150, which are formed on the substrate 110, are converted into a high-resistance layer or insulating layer by implanting counter doping ions into the above layers.

The wirings 170 are formed to electrically connect the electrically isolated light emitting cells 100a and 100b to each other. At this time, each of the wirings 170 may be formed of a metallic material such as Ag, Cu, Al, W or Ti, but the present invention are not limited thereto. That is, the wirings 170 may be formed of a semiconductor material such as polysilicon.

Although it has been described in the embodiments of the present invention that the N-type and P-type semiconductor layers 130 and 150 are positioned respectively at lower and upper portions of the light emitting device, the present invention is not limited thereto. That is, the P-type and N-type semiconductor layers 150 and 130 may be positioned respectively at lower and upper portions of the light emitting device.

FIGS. 7 to 10 are sectional views illustrating a method of fabricating a light emitting device according to an embodiment of the present invention.

Figure 7:
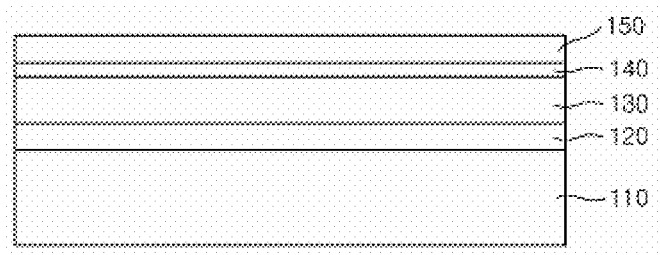
FIGS. 7 to 10 are sectional views illustrating a method of fabricating a light emitting device according to an embodiment of the present invention.

Referring to FIG. 7, an N-type semiconductor layer 130, an active layer 140 and a P-type semiconductor layer 150 are formed on a substrate 110. The substrate 110 may be an $Al_2O_3$, SiC, ZnO, Si, GaAs, GaP, $LiAl_2O_3$, BN, AlN or GaN substrate. The substrate 110 may be an insulating or conductive substrate. Further, each of the N-type semiconductor layer 130, the active layer 140 and the P-type layer 150 may be formed either as a GaN-based compound semiconductor through an MOCVD or MBE process. Meanwhile, a buffer layer 120 may be formed before the N-type semiconductor layer 130 is formed. The buffer layer 120 may be formed of, for example, a III-nitride compound semiconductor such as GaN, AlN or InN.

Figure 8:
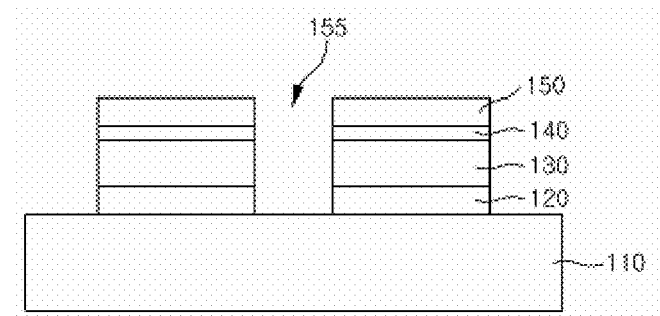

Referring to FIG. 8, the lower semiconductor layer 130, the active layer 140 and the upper semiconductor layer 150, which are formed on the substrate 110, are patterned using photolithographic and etching processes to form a trench 155 which isolates light emitting cell regions from each other. As a result, the light emitting cell regions are defined by the trench 155. At this time, the buffer layer 120 may also be etched together with the above layers.

Figure 9:
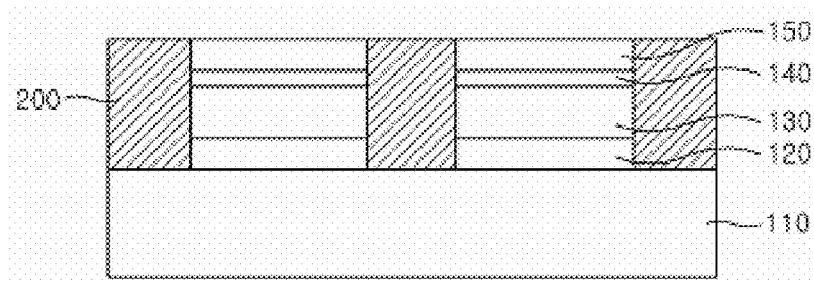

Referring to FIG. 9, the trench 155 is filled with an isolating insulative layer 200. The isolating insulative layer 200 may be a transparent insulating material, e.g. $SiO_2$ or SOG.

In a case where the trench 155 is filled with SOG, the SOG may be spin coated at a rotation speed of 100 to 6000 rpm for 5 to 60 seconds. Accordingly, the SOG is uniformly coated on the substrate 110, and the trench 155 is filled with the SOG. Then, an SOG film is formed by curing the SOG at a temperature of about 100 to 300° C. for about 20 to 200 seconds. The process of coating and curing the SOG can be repeatedly performed several times. Accordingly, it is possible to prevent voids from being formed in the trench 155. Furthermore, the SOG film is formed not only in the trench 155 but also on top of the P-type semiconductor layer 150. The SOG film formed on the P-type semiconductor layer 150 may be removed using a Chemical Mechanical Polishing (CMP) process or an entire surface etching process.

Figure 10:
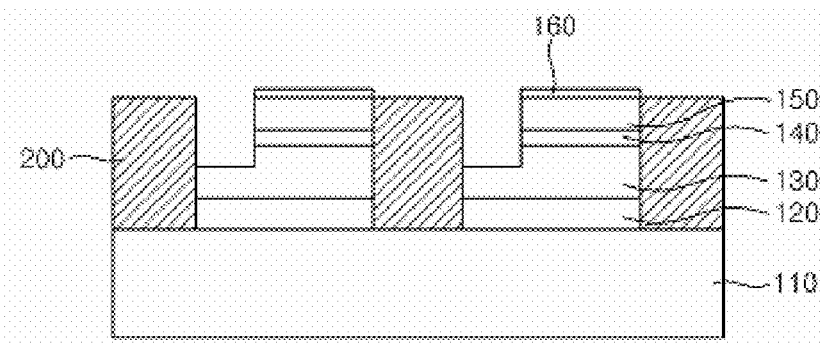

Referring to FIG. 10, portions of the P-type semiconductor layer 150 and the active layer 140 are removed in each of the light emitting cell regions using photolithographic and etching processes to expose a portion of the N-type semiconductor layer 130. Accordingly, a plurality of light emitting cells isolated from one another by the isolating insulative layer 200 are formed on the substrate 110.

Then, a transparent electrode layer 160 is formed on the P-type semiconductor layer 150. The transparent electrode layer 160 may be formed of ITO or Ni/Au using a lift-off process.

Subsequently, wirings 170 (shown in FIG. 5) for connecting the light emitting cells are formed such that the light emitting cells are electrically connected to each other. The wirings 170 may be formed through a step-cover process. That is, a photoresist pattern is formed on the light emitting cells and the isolating insulative layer 200 to expose the light emitting cells and the isolating insulative layer 200 at regions where the wirings 170 will be formed. Thereafter, a conductive material is deposited using a plating or depositing process, and the photoresist pattern is then removed. As a result, the wirings 170 for connecting the light emitting cells 100a and 100b are formed.

Then, a wavelength conversion material layer 180 (shown in FIG. 5) containing phosphors is formed on the substrate 110 with the wirings 170 formed thereon. The wavelength conversion material layer 180 may be formed by applying a transparent material containing phosphors, e.g. epoxy or silicone resin to cover the light emitting cells. The transparent material can be applied through a molding or spraying process. Further, the wavelength conversion material layer 180 may be formed by putting a cap with an inlet onto the substrate 110 with the wirings 170 formed thereon, injecting the resin containing phosphors into the inlet and then curing the resin.

In this embodiment, the positions of the N-type and P-type semiconductor layers 130 and 150 may be interchanged. Further, the transparent electrode layer 160 may be formed before the N-type semiconductor layer 130 is exposed.

Figure 11:
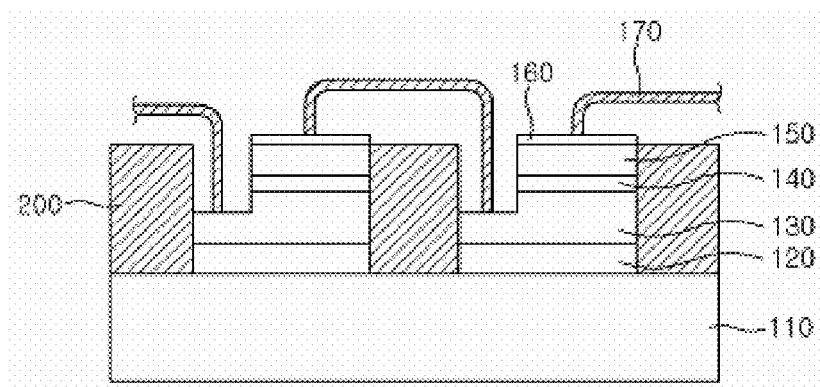
FIG. 11 is a sectional view illustrating a process of forming air-bridge wirings applicable to some embodiments of the present invention.

Meanwhile, the wirings 170 may also be formed using an air-bridge process. FIG. 11 is a sectional view illustrating a process of forming air-bridge wirings 170 applicable to some embodiments of the present invention.

Referring to FIG. 11, a photoresist is applied on a substrate 110 with light emitting cells formed thereon, and a first photoresist pattern that exposes a region of an N-type semiconductor layer 130 of one light emitting cell 100a (shown in FIG. 5) and a portion of a transparent electrode layer 160 of another light emitting cell 100b adjacent to the cell 100a is then formed through a photolithography process. Thereafter, a first metal film is formed such that the exposed N-type semiconductor layer 130 and transparent electrode layer 160 are electrically connected to each other. Then, a second photoresist pattern is formed on the first photoresist pattern. The second photoresist pattern has openings each of which exposes a region where a wiring will be formed, and the first metal film is exposed through the openings. Then, a second metal film is formed on the second photoresist pattern. The second metal film is formed using the first metal layer as a seed. Thereafter, the first and second photoresist patterns are removed such that the wirings 170 connecting the light emitting cells remain.

Then, a wavelength conversion material layer 180 (FIG. 5) may be formed on the substrate 110 with the wirings 170 formed thereon.

Figure 12:
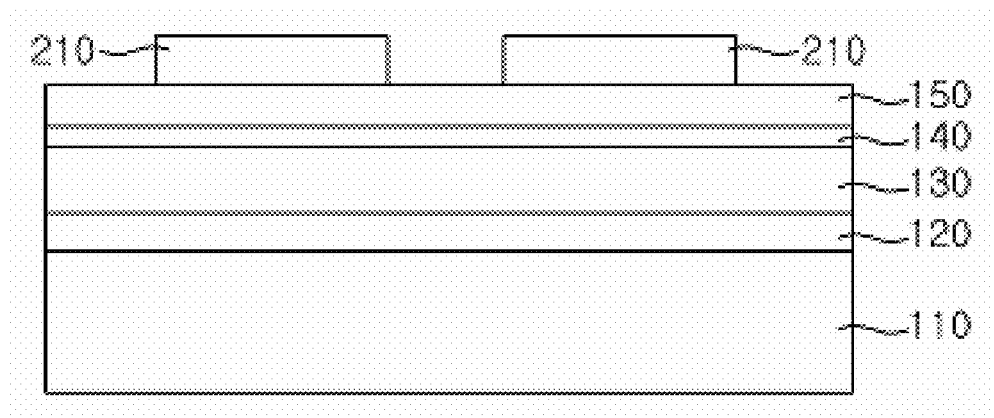
FIGS. 12 and 13 are sectional views illustrating a light emitting device according to another embodiment of the present invention.
Figure 13:
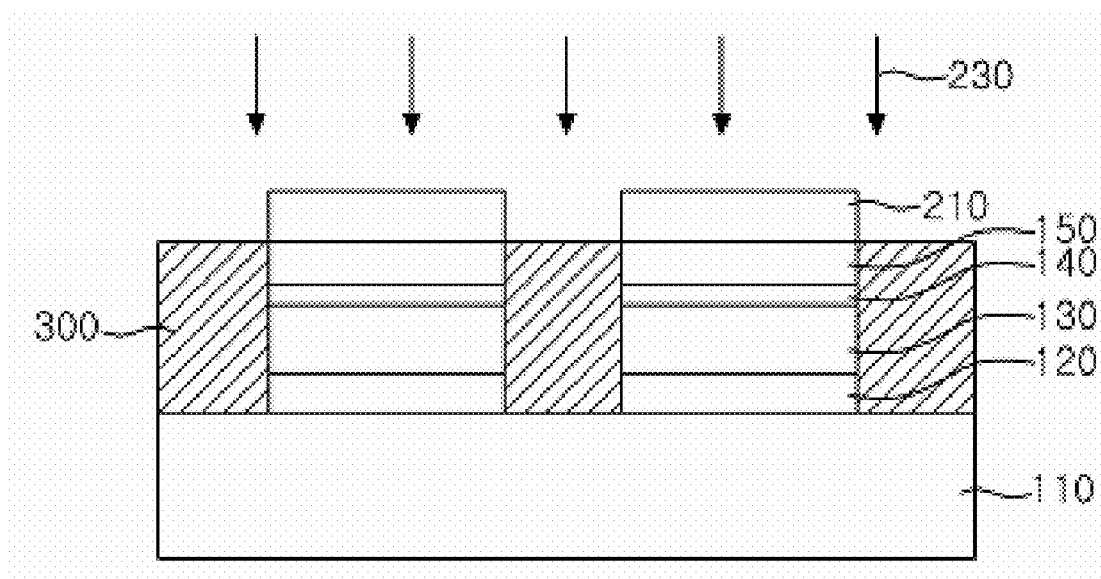

FIGS. 12 and 13 are sectional views illustrating a light emitting device according to another embodiment of the present invention.

Referring to FIG. 12, a buffer layer 120, an N-type semiconductor layer 130, an active layer 140 and a P-type semiconductor layer 150 are formed on a substrate 110 as described with reference to FIG. 7. Then, mask patterns 210 which define light emitting cell regions are formed on the P-type semiconductor layer 150.

The mask patterns 210 may be formed of, for example, silicon oxide or silicon nitride. That is, a mask layer made of silicon oxide, silicon nitride or the like may be formed on the P-type semiconductor layer 150 and be then patterned using photolithographic and etching processes, so that the mask patterns 210 can be formed on the light emitting cell regions, respectively.

Referring to FIG. 13, ions 230 are injected through an ion implantation process using the mask patterns 210 as a mask. Thus, the mask patterns 210 prevent ions from being implanted into the light emitting cell regions, and thus, ions are implanted into the semiconductor layers adjacent to the light emitting cell regions. The ions may be implanted into the P-type semiconductor layer 150, the active layer 140, the N-type semiconductor layer 130 and the buffer layer 120. At this time, in order to allow the respective semiconductor layers 120 to 150 to be counter-doped, ions may be implanted into the semiconductor layers by adjusting Rp several times. Meanwhile, the counter doping is to convert a conductive semiconductor layer into a high-resistance or insulating semiconductor layer. Thus, in a case where the buffer layer 120 or active layer 140 is an insulating layer, the counter doping may be performed restrictively on the N-type and P-type semiconductor layers 130 and 150. Meanwhile, the ions may be implanted into an upper region of the substrate in order to ensure the electrical insulation between the adjacent light emitting cells.

The ions may be selected among, for example, N, O, Fe and V and also be implanted at the dosage of $10^{15}$ to $10^{22}$ ions/$cm^2$ under the ion implantation energy within a range of 10 to 10000 KeV. Thereafter, the mask patterns 210 are removed.

As described with respect to FIG. 10, a region of the N-type semiconductor layer 130 is exposed, a transparent electrode layer 160 is formed, and wirings 170 (shown in FIG. 5 or 11) are then formed. Subsequently, a wavelength conversion material layer 180 may be formed on the substrate 110 with the wirings 170 formed thereon.

According to this embodiment of the present invention, since an isolating insulative layer 200 is formed through an ion implantation process without etching the buffer layer 120, the N-type semiconductor layer 130, the active layer 140 and the P-type semiconductor layer 150, damages due to the etching process can be prevented.

Meanwhile, in the aforementioned embodiments of the present invention, electrode pads (not shown) may be formed on the N-type semiconductor layer 130 and/or the transparent electrode layer 160, and the wirings 170 may be connected to the electrode pads.

The invention claimed is:

1. A light emitting device, comprising:
   a substrate;
   a plurality of light emitting cells disposed on the substrate and each comprising a lower semiconductor layer, an upper semiconductor layer positioned on one region of the lower semiconductor layer, and an active layer interposed between the lower and upper semiconductor layers;
   an isolating insulative layer filled in regions between the plurality of light emitting cells to isolate the light emitting cells from one another; and
   wirings electrically connecting the light emitting cells, each wiring connecting the lower semiconductor layer of one light emitting cell and the upper semiconductor layer of another light emitting cell adjacent to the one light emitting cell,
   wherein the isolating insulative layer comprises a structure stacked with semiconductor layers that are counter-doped through an ion implantation process.

2. The light emitting device of claim 1, wherein the isolating insulative layer has substantially the same height as the light emitting cells.

3. The light emitting device of claim 1, wherein the isolating insulative layer comprises $SiO_2$ or Spin on Glass.

4. The light emitting device of claim 1, wherein each of the counter-doped semiconductor layers has at least one kind of ions selected from the group consisting of N, O, Fe and V injected into the respective layer at the dosage of $10^{15}$ to $10^{22}$ ions/cm$^2$.

5. The light emitting device of claim 1, further comprising transparent electrode layers positioned on the respective upper semiconductor layers of the plurality of light emitting cells, wherein each of the wirings is electrically connected to the upper semiconductor layer through the transparent electrode layer.

6. The light emitting device of claim 1, further comprising a wavelength conversion material layer comprising phosphors, wherein the wavelength conversion material layer covers the light emitting cells and the isolating insulative layer.

* * * * *